United States Patent [19]

Lur et al.

[11] Patent Number: 5,292,680
[45] Date of Patent: Mar. 8, 1994

[54] METHOD OF FORMING A CONVEX CHARGE COUPLED DEVICE

[75] Inventors: Water Lur, Taipei; J. Y. Wu, Dou-Lio; Jenn-Tarng Lin, Taipei, all of Taiwan

[73] Assignee: United Microelectronics Corporation, Hsinchu, Taiwan

[21] Appl. No.: 57,883

[22] Filed: May 7, 1993

[51] Int. Cl.$^5$ .......................................... H01L 21/339
[52] U.S. Cl. ........................................ 437/53; 437/933; 437/941; 437/985
[58] Field of Search ................ 437/2, 3, 50, 53, 44, 437/933, 941, 982, 985; 148/DIG. 116, DIG. 133

[56] References Cited

U.S. PATENT DOCUMENTS

| | | | |
|---|---|---|---|
| 3,792,322 | 2/1974 | Boyle et al. | 257/216 |
| 3,924,319 | 12/1975 | Mohsen | 437/152 |
| 4,750,971 | 6/1988 | Maas et al. | 437/53 |
| 5,132,251 | 7/1992 | Kim et al. | 437/3 |
| 5,185,271 | 2/1993 | Bakker | 437/53 |

FOREIGN PATENT DOCUMENTS 2-260543  10/1990  Japan ................... 437/53
3-161941   7/1991  Japan ................... 437/53

*Primary Examiner*—T. N. Quach
*Assistant Examiner*—Chandra Chaudhari
*Attorney, Agent, or Firm*—George O. Saile

[57] ABSTRACT

A new method of fabricating a convex charge coupled device is achieved. A silicon oxide layer is formed over the surface of a silicon substrate and patterned with a charge coupled device (CCD) electrode mask to provide openings to the silicon substrate. Nitride spacers are formed on the sidewalls of the openings. The integrated circuit is coated with a spin-on-glass layer. After curing, the spin-on-glass layer is etched back to expose the nitride spacers. Removing the nitride spacers leaves a second set of openings to the silicon substrate. Ions are implanted into the substrate through the second set of openings. The oxide layer is removed. The wafer is globally oxidized resulting in a thermal oxide layer with undulatory thickness. The thermal oxide is removed leaving a convex surface on the silicon substrate. A gate oxide layer is formed on the convex surface of the silicon substrate. A polysilicon layer is deposited overlying the gate oxide layer and patterned to form gate electrodes to complete formation of the charge coupled device.

25 Claims, 3 Drawing Sheets

METHOD OF FORMING A CONVEX CHARGE COUPLED DEVICE

BACKGROUND OF THE INVENTION 1. Field of the Invention

This invention relates to the fabrication of integrated circuit devices and more particularly to a method of forming a convex charge coupled device in the manufacture of integrated circuits. 2. Description of the Prior Art A MOS transistor is formed having an extremely long channel and with many, perhaps 1000, gates closely spaced between source and drain. Each gate electrode and the substrate form a MOS capacitor which can store charge. Charge can be transferred from capacitor to capacitor as soon as an appropriate voltage is applied to the electrodes sequentially. This configuration is called a charge transfer device (CTD) or a charge coupled device (CCD). Efficiency of charge transfer is a major concern in the fabrication of charge coupled devices. US Pat. No. 3,792,322 to Boyle et al describes a buried channel charge coupled device. US Pat. No. 3,924,319 to Mohsen describes the use of stepped electrodes in charge coupled devices.

SUMMARY OF THE INVENTION

A principal object of the invention is to provide an effective and very manufacturable method of fabricating charge coupled devices with high transfer efficiency.

Another object of the invention is to provide method of fabricating charge coupled devices which have flat potential energy profiles under the electrodes.

Yet another object of the present invention is to provide a method of fabricating charge coupled devices which have no barriers during charge transformation.

In accordance with the objects of this invention, a new method of fabricating a convex charge coupled device is achieved. A silicon oxide layer is formed over the surface of a silicon substrate and patterned with a charge coupled device (CCD) electrode mask to provide openings to the silicon substrate. Nitride spacers are formed on the sidewalls of the openings. The integrated circuit is coated with a spin-on-glass layer. After curing, the spin-on-glass layer is etched back to expose the nitride spacers. Removing the nitride spacers leaves a second set of openings to the silicon substrate. Ions are implanted into the substrate through the second set of openings. The oxide layer is removed. The wafer is globally oxidized resulting in a thermal oxide layer with undulatory thickness. The thermal oxide is removed leaving a convex surface on the silicon substrate. A gate oxide layer is formed on the convex surface of the silicon substrate. A polysilicon layer is deposited overlying the gate oxide layer and patterned to form gate electrodes to complete formation of the charge coupled device.

BRIEF DESCRIPTION OF THE DRAWINGS

In the accompanying drawings forming a material part of this description, there is shown.

DESCRIPTION OF THE PREFERRED EMBODIMENTS

Figure 1:
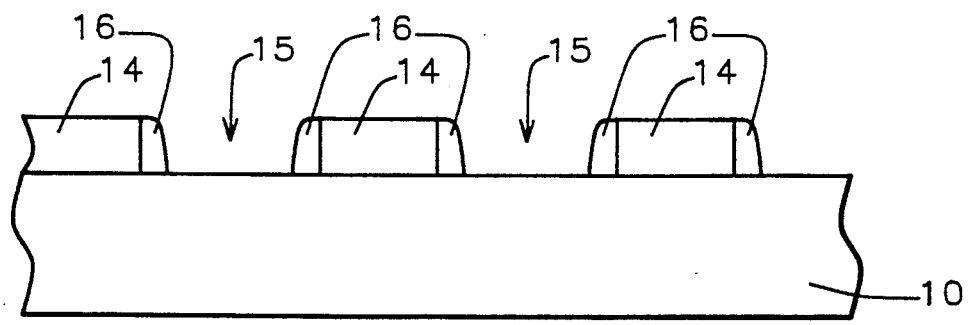
FIGS. 1 through 5 schematically illustrate in cross-sectional representation one preferred embodiment of the present invention.

Referring now more particularly to FIG. 1, there is shown a monocrystalline silicon substrate 10. A layer 14 of silicon oxide is deposited over the substrate by chemical vapor deposition to a preferred thickness of between about 3000 to 10000 Angstroms. The silicon oxide layer 14 is patterned using conventional lithography and etching techniques, such as plasma dry etching with reaction gases $CHF_3$ and $O_2$, to provide openings 15 to the silicon substrate 10.

Figure 2:
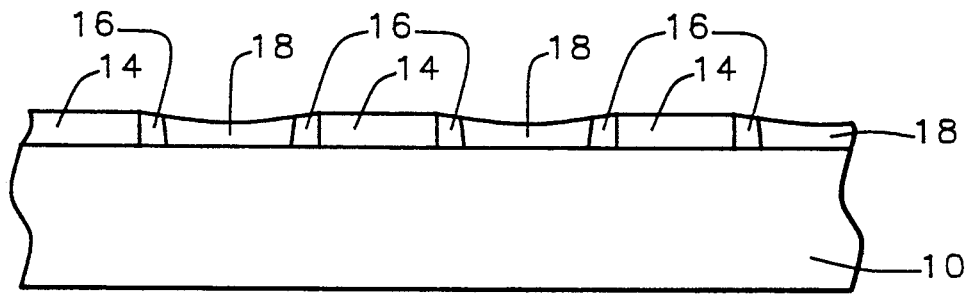
Figure 3:
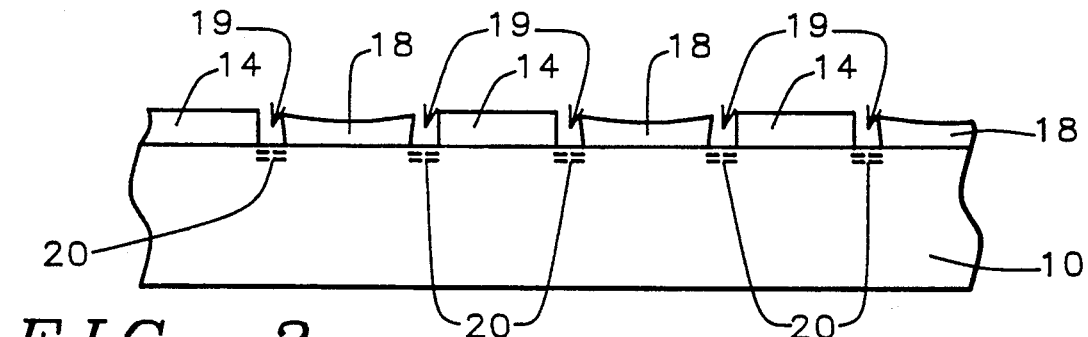

Referring now to FIG. 2, a spin-on-glass coating 18 with a thickness of between about 2000 to 6000 Angstroms is applied to the wafer. A siloxane spin-on-glass material is preferred, but a silicate SOG may be used. The spin-on-glass material suspended in the vehicle or solvent is deposited onto the semiconductor wafer surface and uniformly spread thereover by the action of spinning the wafer. The material fills the indentations in the integrated circuit wafer surface. Most of the vehicle or solvent is driven off by a low temperature baking step. This is followed by a conventional curing step. Next, the spin-on-glass layer is etched back, using conventional oxide etching techniques to uncover the silicon nitride spacers 16. The silicon nitride spacers 16 are removed by an $H_3PO_4$ chemical etch leaving a second set of openings 19 to the substrate as seen in FIG. 3.

P+ and N+ ions at the same dosage are implanted together into each opening resulting in an electrically neutral implantation 20. $BF_2+$ ions are used for the P+ implantation and phosphorus (P) or arsenic (As) ions are used for the N+ implantation to a dose of between about 1 E 15 to 1 E 16 atoms/$cm^2$. Alternatively, oxygen ions may be implanted to the same dosage.

Figure 4:
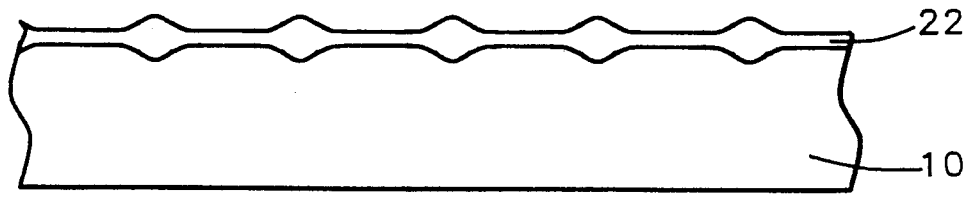

Referring now to FIG. 4, the silicon oxide layer 14 is stripped by dipping the wafer in diluted hydrofluoric acid. The wafer is globally oxidized; that is, without any mask; resulting in a thermal oxide layer 22 with undulatory thickness. The thermal oxide grows more quickly on the heavily implanted silicon areas 20 than on those areas without implantation; hence, the resulting undulatory thickness of the layer 22.

Figure 5:
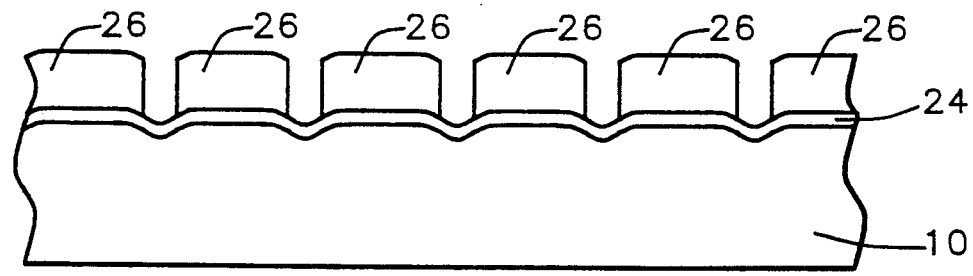

The thermal oxide layer 22 is stripped by dipping the wafer in diluted hydrofluoric acid. A gate oxide layer 24 in FIG. 5 is formed over the now convex surface of the silicon substrate. Polysilicon layer 26 is chemical vapor deposited to a thickness of between about 2000 to 10000 Angstroms and patterned as is conventional in the art. Polysilicon layer 26 may be composed of two layers of polysilicon and silicide. One of the transition metal silicides, such as $TiSi_2$, $COSi_2$, $WSi_2$, $TaSi_2$, $MOSi_2$, and the like, with a thickness of less than half the thickness of the gate electrodes is deposited on polysilicon to form the polycide structure. This completes construction of the charge coupled device.

Figure 6:
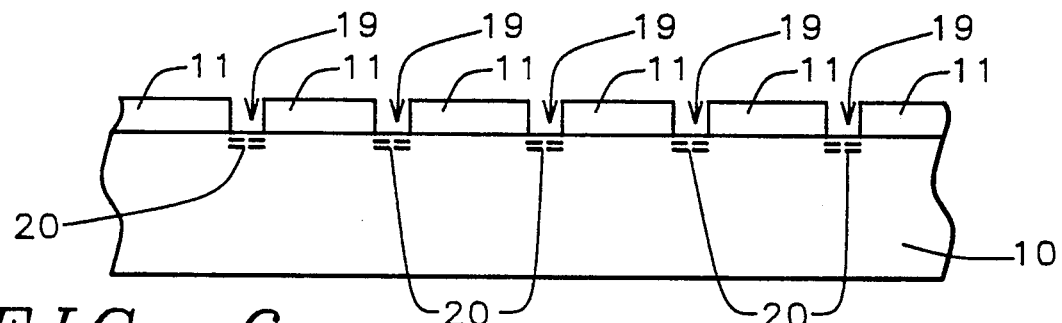
FIGS. 6 and 7 schematically illustrate in cross-sectional representation a second preferred embodiment of the present invention.
Figure 7:
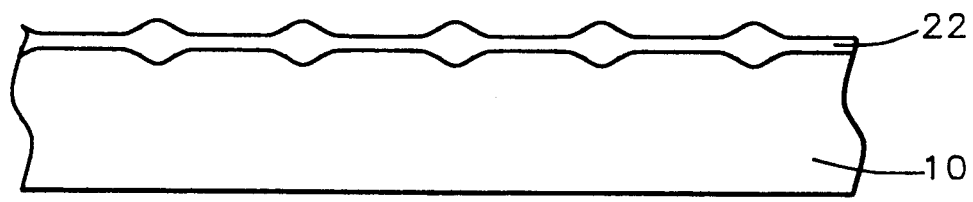

In a second preferred embodiment of the present invention, a silicon substrate 10 is coated with a layer of photoresist 11, shown in FIG. 6. The photoresist is patterned to provide openings 19 to the silicon substrate. P+ and N+ ions are implanted 20 as described above in the first embodiment. The photoresist layer is stripped and a thermal oxide layer 22 is formed as described above and as shown in FIG. 7. The thermal silicon oxide layer is now stripped and gate silicon oxide and polysilicon layers deposited as described above to result in FIG. 5.

Figure 8:
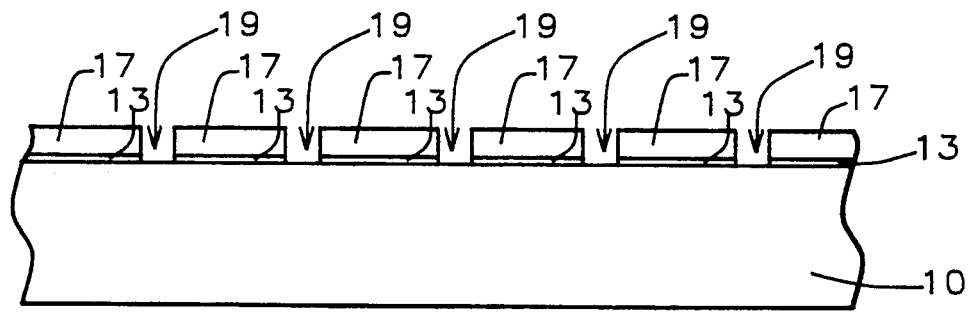
FIGS. 8 and 9 schematically illustrate in cross-sectional representation a third preferred embodiment of the present invention.
Figure 9:
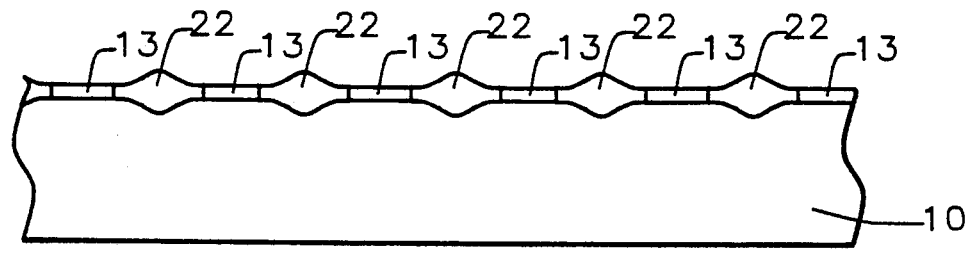

In a third preferred embodiment of the invention, shown in FIG. 8, a silicon substrate 10 is covered with a pad silicon oxide 13. This pad oxide is used to release thermal stress during subsequent oxidation. It is thermally grown or chemically vapor deposited to a thickness of between about 100 to 1000 Angstroms. A layer of silicon nitride 17 is deposited by chemical vapor deposition to a thickness of between about 500 to 3000 Angstroms. The silicon oxide and silicon nitride layers 13 and 17 are patterned as is conventional in the art to provide openings 19 to the silicon substrate. Referring to FIG. 9, thermal oxide is grown on the exposed surfaces of the substrate. There is some lateral diffusion of the thermal oxide under the silicon nitride mask, resulting in the convex shape of the silicon surface under the thermal oxide 22. The silicon nitride layer 17 is stripped by phosphoric acid at a temperature of between about 150° to 180° C. The pad oxide and thermal oxide layers, 13 and 22 respectively, are now stripped and the gate silicon oxide 24 and polysilicon 26 layers are deposited as described above in the first embodiment to result in FIG. 5.

Figure 10:
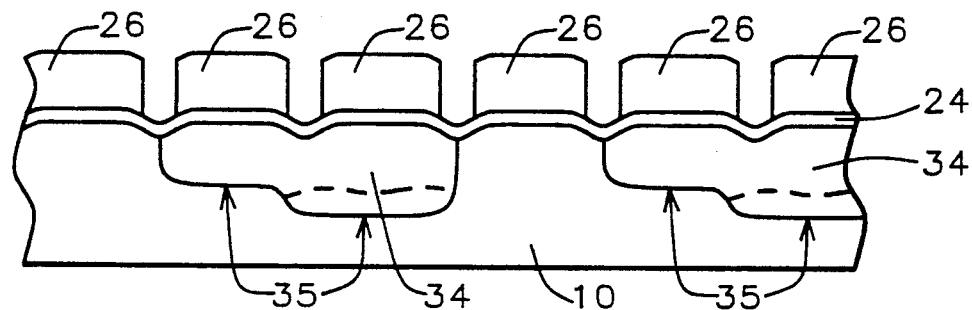
FIG. 10 schematically illustrates in cross-sectional representation a completed charge coupled device of the present invention.
Figure 11:
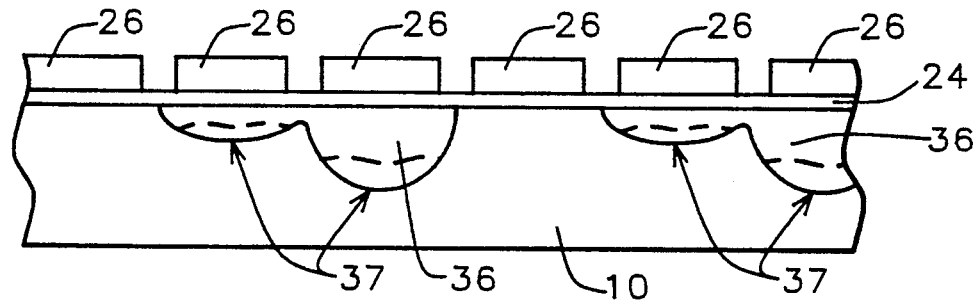
FIG. 11 schematically illustrates in cross-sectional representation a prior art charge coupled device.

FIG. 10 illustrates the completed convex charge coupled device for high speed signal transformation of the present invention. The charge is illustrated by 34. The potential energy profiles 35 are flat; thus presenting no barrier to the charge transformation. FIG. 11 illustrates a planar charge coupled device of the prior art. The charge is illustrated by 36. The potential energy profiles 37 are concave under the electrodes. This presents a barrier to the charge transformation, limiting efficiency of transfer as well as limiting the upper frequency. The barrier comes from the superposition of electrical potentials originated from two gate electrodes. The upper frequency limit is determined by such variables as the electrode length, channel doping, CCD structure, gate oxide thickness. The present invention allows for greater efficiency of transfer and a higher upper frequency.

While the invention has been particularly shown and described with reference to the preferred embodiments thereof, it will be understood by those skilled in the art that various changes in form and details may be made without departing from the spirit and scope of the invention.

What is claimed is:

1. The method of fabricating a convex charge coupled device in an integrated circuit comprising:
   forming a silicon oxide layer over the surface of a silicon substrate;
   patterning said silicon oxide layer to provide openings to said silicon substrate;
   forming nitride spacers on the sidewalls of said patterned oxide layer;
   coating said integrated circuit with a spin-on-glass layer and curing said spin-on-glass layer;
   etching back said spin-on-glass layer to expose said nitride spacers;
   removing said nitride spacers leaving a second set of openings to said silicon substrate;
   implanting ions into said substrate through said second set of openings;
   removing said silicon oxide layer;
   providing global thermal oxidation;
   removing said thermal oxide leaving a convex surface on said silicon substrate;
   forming a gate silicon oxide layer on said convex surface of said silicon substrate;
   depositing a polysilicon layer overlying said gate silicon oxide layer; and
   patterning said polysilicon layer to form gate electrodes to complete formation of said charge coupled device.

2. The method of claim 1 wherein said nitride spacers are formed by depositing a layer of silicon nitride overlying said silicon oxide layer and within said openings whereby said silicon nitride layer has a preferred thickness of between about 1000 and 10000 Angstroms and whereby said silicon nitride layer is etched by plasma dry etching to form spacers on the sidewalls of said patterned oxide layer.

3. The method of claim 1 wherein said spin-on-glass layer is composed of siloxane material.

4. The method of claim 1 wherein said spin-on-glass layer is composed of silicate material.

5. The method of claim 1 wherein said ion implantation is conducted with both P+ and N+ implantation to the same dosage of between about $1 \text{ E } 15$ to $1 \text{ E } 16$ atoms/cm$^2$.

6. The method of claim 1 wherein said ion implantation is conducted with oxygen with a dosage of between about $1 \text{ E } 15$ to $1 \text{ E } 16$ atoms/cm$^2$.

7. The method of claim 1 wherein said silicon oxide layer is removed by diluted hydrofluoric acid.

8. The method of claim 1 wherein said thermal oxidation is global and results in a thermal oxide layer with undulatory thickness caused by a faster oxidation rate on portions of said substrate accessed by said second set of openings through which said ion implantation is performed.

9. The method of claim 1 wherein said thermal oxide is removed by diluted hydrofluoric acid.

10. The method of claim 1 wherein said gate silicon oxide layer has a thickness of between about 80 to 1000 Angstroms.

11. The method of claim 1 wherein said polysilicon layer is a polycide structure wherein a transition metal silicide is deposited on a layer of polysilicon resulting in a combined thickness of between about 2000 and 10000 Angstroms.

12. The method of fabricating a convex charge coupled device in an integrated circuit comprising:
   coating the surface of a silicon substrate with a photoresist layer;
   patterning said photoresist layer to provide openings to said silicon substrate;
   implanting ions into said substrate through said openings;
   removing said photoresist layer;
   globally thermally oxidizing said silicon substrate;
   removing said thermal oxide leaving a convex surface on said silicon substrate;
   forming a gate silicon oxide layer on said convex surface of said silicon substrate;

depositing a polysilicon layer overlying said gate oxide layer; and patterning said polysilicon layer to form gate electrodes to complete formation of said charge coupled device.

13. The method of claim 12 wherein said ion implantation is conducted with both P+ and N+ implantation to the same dosage of between about 1 E 15 to 1 E 16 atoms/cm$^2$.

14. The method of claim 12 wherein said ion implantation is conducted with oxygen implantation to a dosage of between about 1 E 15 to 1 E 16 atoms/cm$^2$.

15. The method of claim 12 wherein said global thermal oxidation is performed at a temperature of between about 800° to 1200° C. in an oxygen ambient to a thickness of between about 3000 to 10000 Angstroms and whereby said thickness is undulatory caused by a faster oxidation rate on portions of said substrate accessed by said through which said ion implantation is performed.

16. The method of claim 12 wherein said thermal oxide is removed by diluted hydrofluoric acid.

17. The method of claim 12 wherein said gate silicon oxide layer has a thickness of between about 80 to 1000 Angstroms.

18. The method of claim 12 wherein said polysilicon layer is a polycide structure wherein a transition metal silicide is deposited on a layer of polysilicon resulting in a combined thickness of between about 2000 and 10000 Angstroms.

19. The method of fabricating a convex charge coupled device in an integrated circuit comprising:

forming a silicon oxide layer on the surface of a silicon substrate;

depositing a silicon nitride layer overlying said silicon oxide layer;

patterning said silicon nitride and silicon oxide layers to provide openings to said silicon substrate;

thermally oxidizing said silicon substrate;

removing said nitride layer;

removing said silicon oxide and said thermal oxide layers leaving a convex surface on said silicon substrate;

forming a gate silicon oxide layer on said convex surface of said silicon substrate;

depositing a polysilicon layer overlying said gate oxide layer; and patterning said polysilicon layer to form gate electrodes to complete formation of said charge coupled device.

20. The method of claim 19 wherein said silicon oxide layer is deposited to a thickness of between about 100 to 1000 Angstroms.

21. The method of claim 19 wherein said silicon nitride layer is deposited by chemical vapor deposition to a thickness of between about 500 to 3000 Angstroms.

22. The method of claim 19 wherein said thermal oxidation is performed on portions of said silicon substrate exposed by said openings and wherein there is lateral diffusion of said thermal oxide under said silicon nitride resulting in the convex shape of surface of said silicon substrate under said thermal oxide.

23. The method of claim 19 wherein said field oxide is removed by diluted hydrofluoric acid.

24. The method of claim 19 wherein said gate silicon oxide layer has a thickness of between about 80 to 1000 Angstroms.

25. The method of claim 19 wherein said polysilicon layer is a polycide structure wherein a transition metal silicide is deposited on a layer of polysilicon resulting in a combined thickness of between about 2000 and 10000 Angstroms.

* * * * *